(12) United States Patent
Yoshida et al.

(10) Patent No.: US 7,682,482 B2
(45) Date of Patent: Mar. 23, 2010

(54) PLASMA GENERATION APPARATUS AND WORK PROCESSING APPARATUS

(75) Inventors: Kazuhiro Yoshida, Wakayama (JP); Ryuichi Iwasaki, Wakayama (JP); Hirofumi Mankawa, Wakayama (JP)

(73) Assignee: Noritsu Koki Co., Ltd., Wakayama (JP)

( * ) Notice: Subject to any disclaimer, the term of this patent is extended or adjusted under 35 U.S.C. 154(b) by 398 days.

(21) Appl. No.: 11/703,038

(22) Filed: Feb. 6, 2007

(65) Prior Publication Data
US 2007/0193516 A1    Aug. 23, 2007

(30) Foreign Application Priority Data
Feb. 20, 2006  (JP)  .............. 2006-042197

(51) Int. Cl.
C23C 16/00 (2006.01)
C23F 1/00 (2006.01)
H01L 21/306 (2006.01)

(52) U.S. Cl. .................. 156/345.41; 118/723 MW; 156/345.34; 156/345.36

(58) Field of Classification Search ......... 118/723 MW; 156/345.41, 345.34, 345.36
See application file for complete search history.

(56) References Cited

U.S. PATENT DOCUMENTS

| | | | |
|---|---|---|---|
| 4,151,034 A * | 4/1979 | Yamamoto et al. ..... | 156/345.31 |
| 5,645,796 A * | 7/1997 | Caputo et al. ................. | 422/22 |
| 7,164,095 B2 | 1/2007 | Lee et al. | |
| 2003/0178140 A1 | 9/2003 | Hanazaki et al. | |
| 2004/0083797 A1* | 5/2004 | Ward et al. .................... | 73/40.7 |
| 2006/0006153 A1 | 1/2006 | Lee et al. | |
| 2006/0021581 A1* | 2/2006 | Lee et al. ............ | 118/723 MW |
| 2006/0021980 A1 | 2/2006 | Lee et al. | |
| 2006/0057016 A1* | 3/2006 | Kumar et al. ................. | 419/56 |
| 2008/0017616 A1 | 1/2008 | Lee et al. | |
| 2008/0073202 A1 | 3/2008 | Lee et al. | |

FOREIGN PATENT DOCUMENTS

| | | |
|---|---|---|
| CN | 2704179 | 6/2005 |
| JP | 6-244140 | 9/1994 |
| JP | 2003-197397 | 7/2003 |

* cited by examiner

Primary Examiner—Parviz Hassanzadeh
Assistant Examiner—Rakesh Dhingra
(74) Attorney, Agent, or Firm—Jordan and Hamburg LLP

(57) ABSTRACT

A plasma generation apparatus is provided which includes: an apparatus main body which has a microwave generation section which generates a microwave and a plasma generation nozzle which generates and emits a plasma gas based on the energy of the microwave; a microwave detection unit which detects a microwave leaking from the apparatus main body; and a control section which stops the microwave generation section from generating a microwave if the detection unit detects a microwave.

11 Claims, 14 Drawing Sheets

PLASMA GENERATION APPARATUS AND WORK PROCESSING APPARATUS

BACKGROUND OF THE INVENTION

1. Field of the Invention

The present invention relates to a plasma generation apparatus which irradiates a work to be processed such as a substrate with plasma, so that its surface can be cleaned or the surface quality can be reformed, and a work processing apparatus provided with this.

2. Description of the Background Art

A work processing apparatus is known which applies plasma to a work to be processed such as a semiconductor wafer. Thereby, it removes organic dirt from its surface, improves the surface's quality, etches the work, forms a thin film, eliminates a thin film, or conducts such another. A plasma processing apparatus is disclosed, for example, in Japanese Patent Laid-Open No. 2003-197397 specification. A plasma generation nozzle is used which includes an interior electric conductor and an exterior electric conductor which are concentric with each other. Between both electric conductors, a high-frequency pulse electric field (i.e., a microwave) is applied, and thereby, not an arc discharge but a glow discharge is produced so that plasma can be generated. In this apparatus, a processing gas from a gas supply source makes its way from the base-end side to the free-end side while whirling round between the interior and exterior electric conductors. Thereby, denser plasma is generated and radiates from a nozzle attached to the free end toward a work to be processed. This helps secure plasma with a high density under a normal pressure.

The above described prior art offers the superior plasma processing apparatus which is capable of obtaining highly-dense plasma under a normal pressure. Such a plasma processing apparatus can be used under a normal pressure, and thus, it is often installed in an area with people coming and going. Hence, in order to prevent a microwave from leaking out, a decision is made whether or not a microwave is leaking, by simulating such or using a measuring device practically in a designing stage or at the time of shipment from a factory.

However, such an apparatus may be vibrated or given a shock when an earthquake occurs or the apparatus is moved for reinstallation. Besides, if a person handles the apparatus carelessly, or if it gets out of order, that can make an impact on it. Such an impact may cause, beyond expectations, a microwave to leak. Therefore, another such apparatus is embodied which has the following structure. The apparatus main body is covered with a shielding frame body which screens out or attenuates a microwave. Even if a microwave leaks inside, it is prevented from leaking outside. However, even if the microwave does not leak out, then depending upon its power (i.e., microwave power), the inside leakage can give heat to some places of the apparatus main body. This may cause some parts of the apparatus to malfunction.

SUMMARY OF THE INVENTION

It is an object of the present invention to provide a plasma generation apparatus which is safer from the leakage of a microwave, and a work processing apparatus provided with this.

In order to attain this object, a plasma generation apparatus according to an aspect of the present invention, comprising: an apparatus main body which includes a microwave generation section which generates a microwave, and a plasma generation nozzle which generates and emits a plasma gas based on the energy of the microwave; a microwave detection unit which detects a microwave leaking from the apparatus main body; and a control section which stops the microwave generation section from generating a microwave if the detection unit detects a microwave.

Furthermore, a plasma generation apparatus according to another aspect of the present invention, comprising: an apparatus main body which includes a microwave generation section which generates a microwave, and a plasma generation nozzle which generates and emits a plasma gas based on the energy of the microwave; a microwave detection unit which detects a microwave leaking from the apparatus main body; and a notification portion which gives notice if the detection unit detects a microwave.

Moreover, a work processing apparatus according to another aspect of the present invention which irradiates a work with plasma and gives a predetermined processing, comprising: a plasma generation apparatus which irradiates the work with a plasma gas from a predetermined direction; and a movement mechanism which moves the work and the plasma generation apparatus relatively on a plane that intersects a direction where a plasma gas is applied, wherein the plasma generation apparatus includes the above described configuration.

These and other objects, features and advantages of the present invention will become more apparent upon reading of the following detailed description along with the accompanied drawings.

BRIEF DESCRIPTION OF THE DRAWINGS

FIG. 3 is a side view of the plasma generation unit, partly seen through.

DESCRIPTION OF THE PREFERRED EMBODIMENTS

First Embodiment

Figure 1:
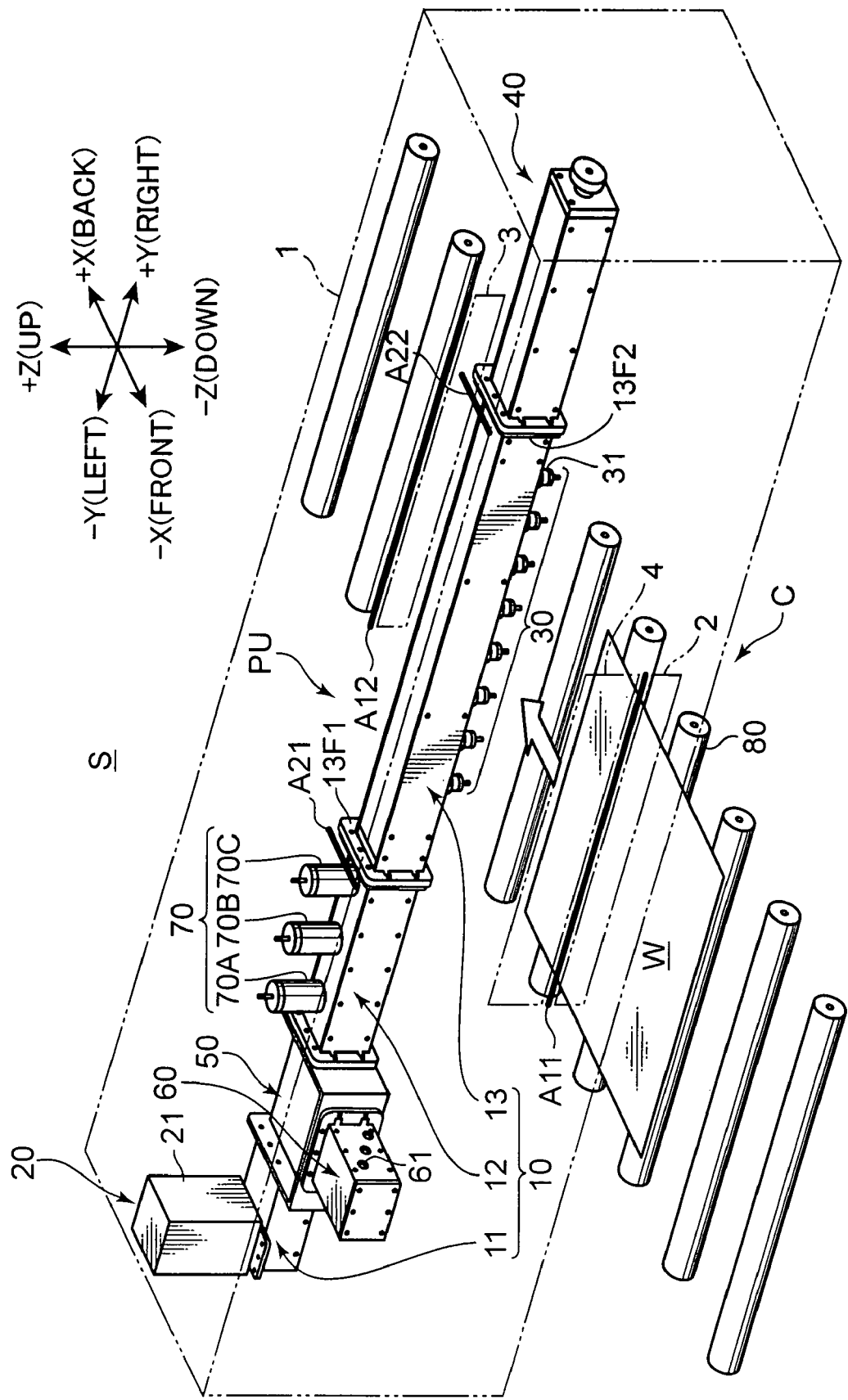
FIG. 1 is a perspective view of a work processing apparatus according to an embodiment of the present invention, showing its whole configuration.

FIG. 1 is a perspective view of a work processing apparatus S according to an embodiment of the present invention, showing its whole configuration. This work processing apparatus S is configured by: a plasma generation unit PU (i.e., the plasma generation apparatus) which generates plasma and irradiates a work W to be processed with this plasma; and a carrying means C which carries the work W on a predetermined route by way of the region where the plasma is applied.

Figure 2:
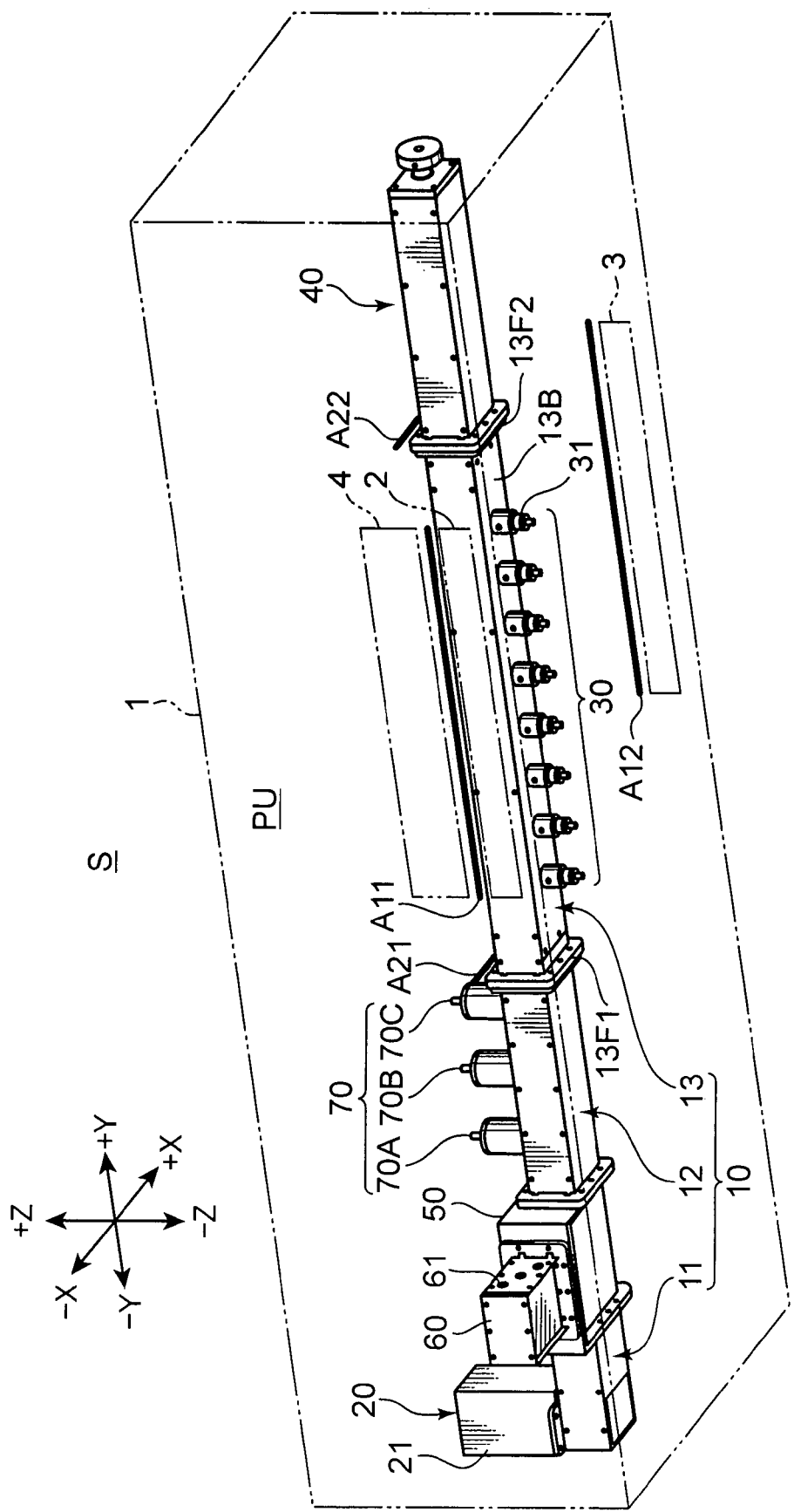
FIG. 2 is a perspective view of a plasma generation unit, seen from a different angle from FIG. 1.
Figure 3:
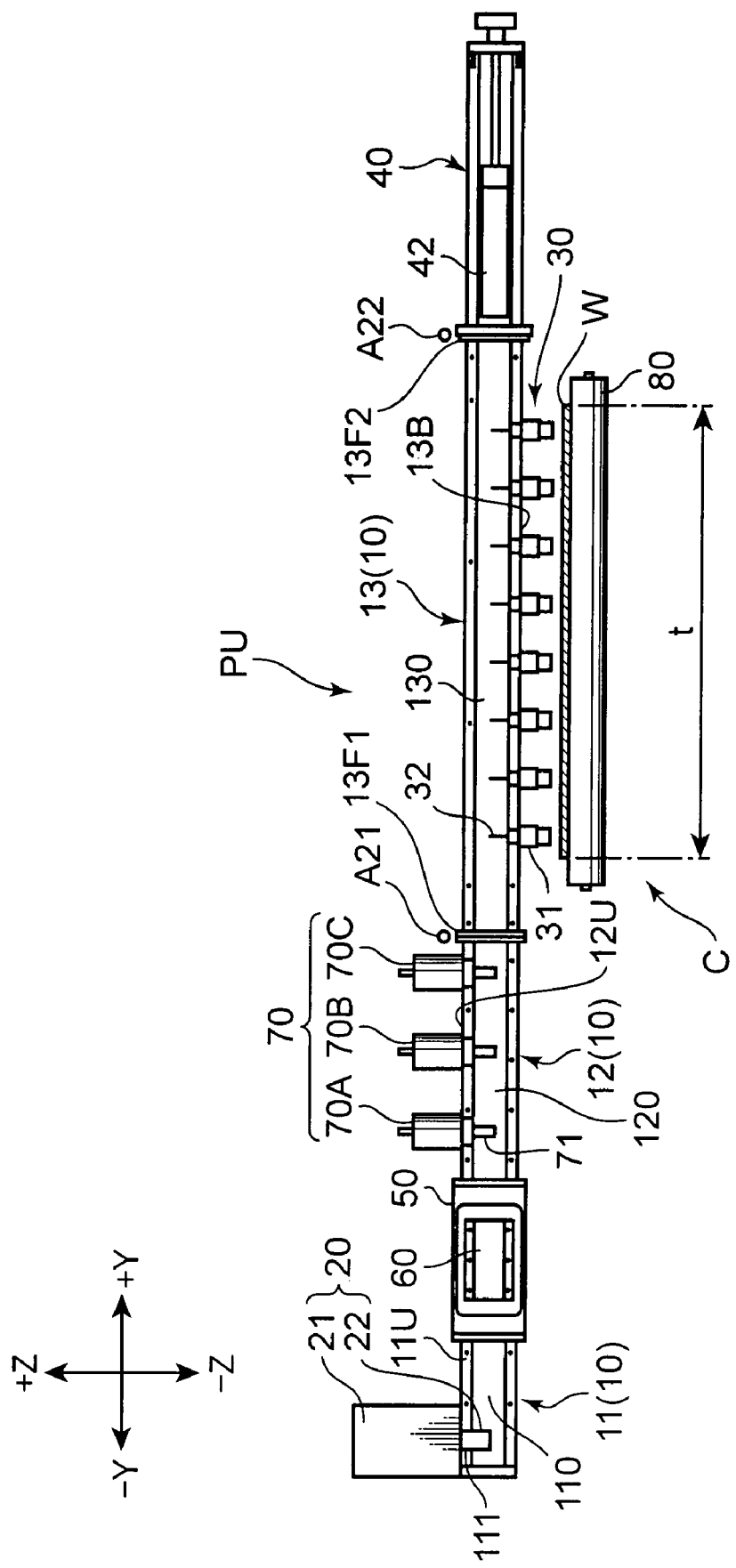

The plasma generation unit PU and a part of the carrying means C is housed in a shielding frame body 1. The carrying means C extends outside from an opening 2 for carrying the work W in and an opening 3 for carrying it out. FIG. 2 is a perspective view of the plasma generation unit PU, seen from a different angle from FIG. 1. FIG. 3 is a side view of the plasma generation unit PU, partly seen through. In FIG. 1 to FIG. 3, the X-X directions represent the front-and-back directions; the Y-Y directions, the right-and-left directions; and the Z-Z directions, the up-and-down directions. Then, the −X direction indicates the front; the +X direction, the back; the −Y direction, the left; the +Y direction, the right; the −Z direction, downward; and the +Z direction, upward.

The plasma generation unit PU is a unit which can generate plasma at a normal temperature and a normal pressure, using a microwave. It is roughly formed by: a wave guide 10 for propagating a microwave; a microwave generation section 20 which is provided at one end (on the left) of this wave guide 10 and generates a microwave having a predetermined wavelength; a plasma generation portion 30 provided in the wave guide 10; a sliding short 40 which is provided at the other end (on the right) of the wave guide 10 and reflects a microwave; a circulator 50 which separates a reflected microwave of the microwave emitted to the wave guide 10 so that the reflected microwave will not return to the microwave generation section 20; a dummy load 60 which absorbs the reflected microwave separated by the circulator 50; and a stub tuner 70 which makes an impedance match between the wave guide 10 and a plasma generation nozzle 31. The carrying means C is formed by carriage rollers 80 which are rotated by a driving means (not shown). In this embodiment, an example is shown in which the flat work W is carried by the carrying means C.

The shielding frame body 1 (i.e., the frame body according to the claimed invention) is formed by a member which can screen out or attenuate a microwave. In order to prevent a microwave from leaking out, it covers the apparatus main body, the plasma generation unit PU (i.e., the apparatus main body according to the claimed invention). The shielding frame body 1 is provided at its front and back side walls with the carrying-in opening 2 and the carrying-out opening 3 of the work W. These are indispensable openings for leading the work W to the shielding frame body 1 and processing it continuously. The shielding frame body 1 is also provided, near the carrying-in opening 2, with a monitoring window 4 for looking into it for a check.

The wave guide 10 is made of a non-magnetic metal such as aluminum and is shaped like a long pipe with a rectangular section. It is used for propagating, in its longitudinal direction, a microwave generated by the microwave generation section 20 toward the plasma generation portion 30. The wave guide 10 is formed by the connection body of a plurality of separate wave-guide pieces to each other at their flange parts. In the mentioned order from one end of it are connected a first wave-guide piece 11 on which the microwave generation section 20 is mounted, a second wave-guide piece 12 (i.e., a second wave guide according to the claimed invention) to which the stab stub tuner 70 is attached, and a third wave-guide piece 13 (i.e., the first wave guide according to the claimed invention) in which the plasma generation portion 30 is disposed. Between the first wave-guide piece 11 and the second wave-guide piece 12, the circulator 50 is disposed, and the sliding short 40 (i.e., a second wave guide according to the claimed invention) is connected to the other end of the third wave-guide piece 13.

Each of the first wave-guide piece 11, the second wave-guide piece 12 and the third wave-guide piece 13 is assembled, using an upper-plane plate, a lower-plane plate 13B and two side-plane plates which are each formed by a metal flat plate, so that they each have a square-pipe shape. Then, they are each formed by attaching a flange plate to both ends. However, instead of the assembly of such flat plates, a rectangular wave-guide piece or a non-separate wave guide may also be used which is formed by extrusion molding, folding a plate-shaped member or the like. Besides, it is not limited to a wave guide with a rectangular section, and thus, for example, a wave guide whose section is elliptic can also be used. In addition, it is not limited to a non-magnetic metal, and thus, such a wave guide can also be formed by each type of member which has a wave-guiding function.

The microwave generation section 20 is made up of: a unit body portion 21 which includes a microwave generation source such as a magnetron which generates a microwave, for example, with a frequency of 2.45 GHz and an amplifier which adjusts the intensity of a microwave generated in this microwave generation source to a predetermined output intensity; and a microwave transmission antenna 22 which radiates a microwave generated in the unit body portion 21 to the inside of the wave guide 10. In the plasma generation unit PU according to this embodiment, for example, the continuously-variable microwave generation section 20 is preferably used which can output a microwave energy of 1 W to 3 kW.

As shown in FIG. 3, the microwave generation section 20 is shaped so that the microwave transmission antenna 22 protrudes from the unit body portion 21. It is placed and fixed on the first wave-guide piece 11. In detail, the unit body portion 21 is placed on an upper-plane plate 11U of the first wave-guide piece 11. Then, the microwave transmission antenna 22 passes through a penetrating hole 111 formed in the upper-plane plate 11U and is fixed so as to protrude into a wave-guidance space 110 inside of the first wave-guide piece 11. According to such a configuration as described above, a microwave, for instance, with a frequency of 2.45 GHz which is radiated from the microwave transmission antenna 22 is propagated through the wave guide 10 from its one end (the left) to the other end (the right).

The plasma generation portion 30 is provided, on a lower-plane plate 13B (i.e., the surface opposite to a work to be processed) of the third wave-guide piece 13, with eight protruding plasma generation nozzles 31 which are disposed in a line in the right-and-left directions. This plasma generation portion 30's width, in other words, how widely the eight plasma generation nozzles 31 are disposed in the right-and-left directions, is substantially equal to a size t of the flat work W in the width direction perpendicular to the direction in which it is carried. Thereby, the work W is subjected, over its entire surface (i.e., the surface opposite to the lower-plane plate 13B), to a plasma processing while being carried by the carriage rollers 80.

It is desirable that the intervals at which the eight plasma generation nozzles 31 are arranged be determined in accordance with a wavelength $\lambda G$ of a microwave propagated inside of the wave guide 10. Preferably, for example, each plasma generation nozzle 31 should be arranged at a half pitch or a quarter pitch of the wavelength λG. If a microwave having a frequency of 2.45 GHz is used, then λG=230 mm. Thereby, the plasma generation nozzles 31 are arranged at 115-mm (λG/2) pitches or 57.5-mm (λG/4) pitches.

Figure 4:
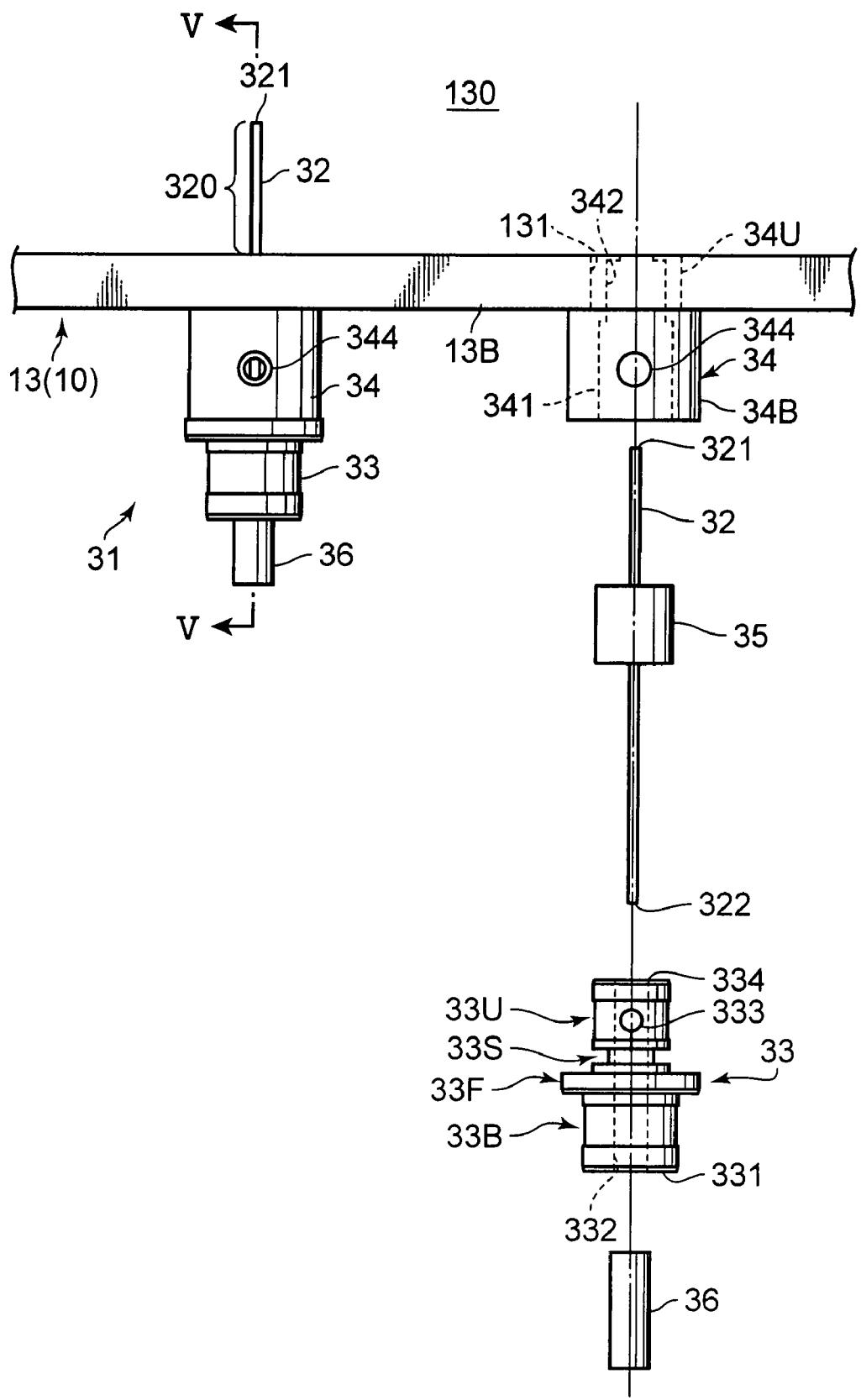
FIG. 4 is an enlarged side view of two plasma generation nozzles (one plasma generation nozzle of which is shown in exploded view).
Figure 5:
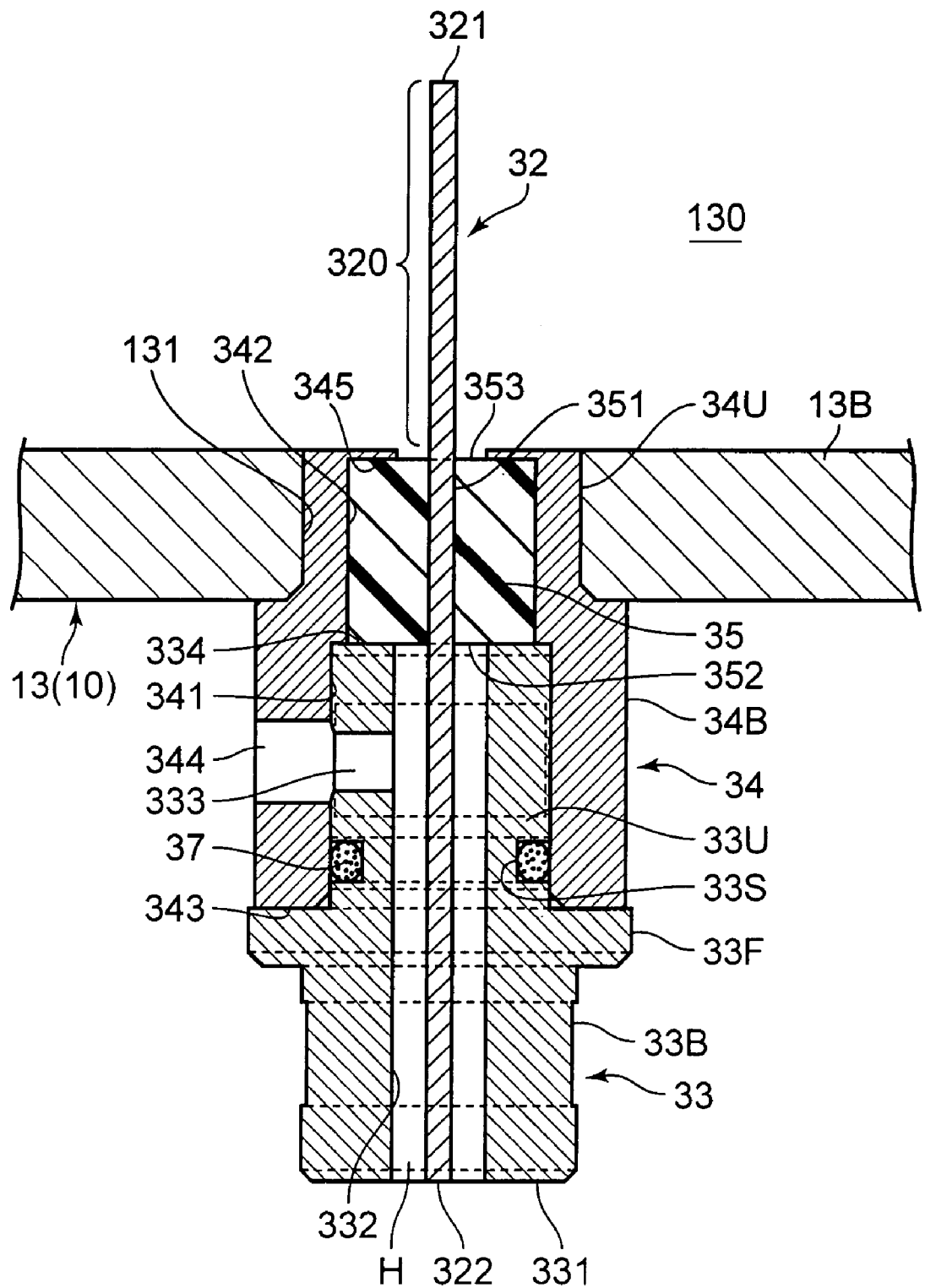
FIG. 5 is a sectional view, seen along the V-V line, of the plasma generation nozzle of FIG. 4.

FIG. 4 is an enlarged side view of two plasma generation nozzles 31 (one plasma generation nozzle 31 of which is shown in exploded view). FIG. 5 is a sectional view, seen along the V-V line of FIG. 4. Each plasma generation nozzle 31 includes a central conductor 32 (i.e., an internal conductor), a nozzle body 33 (i.e., an external conductor), a nozzle holder 34, a seal member 35 and a protective tube 36.

The central conductor 32 is made of a conductive metal such as copper, aluminum and brass and is formed by a stick-shaped member which has a φ of approximately 1 to 5 mm. The side of an upper-end portion 321 thereof penetrates the lower-plane plate 13B of the third wave-guide piece 13 and protrudes by a predetermined length into a wave-guidance space 130 (herein, this protruding portion is referred to as a receiving antenna portion 320). On the other hand, a lower-end portion 322 thereof is disposed on substantially the same plane with a lower-end edge 331 of the nozzle body 33 in the up-and-down directions. In this central conductor 32, the receiving antenna portion 320 receives (detects) a microwave propagated inside of the wave guide 10. Thereby, it is supposed to be given microwave energy (i.e., microwave electric power). The central conductor 32 is held at its substantially middle part in the longitudinal directions by the seal member 35.

The nozzle body 33 is made of a conductive metal and is shaped like a pipe including a cylindrical space 332 which houses the central conductor 32. Besides, the nozzle holder 34 is also made of a conductive metal and is a cylindrical body which includes a lower hold space 341 with a relatively wide diameter for holding the nozzle body 33 and an upper hold space 342 with a relatively narrow diameter for holding the seal member 35. On the other hand, the seal member 35 is made of a heat-resistant resin such as Teflon (which is a registered trademark) or an insulating material such as ceramics. It is a cylindrical body which includes, along its central axis, a hold hole 351 for holding the central conductor 32 fixedly.

The nozzle body 33 is provided, in order from above, with: an upper trunk portion 33U which is fitted into the lower hold space 341 of the nozzle holder 34; a circular concave portion 33S for holding a gas seal ring 37 (described later); a flange portion 33F which protrudes in a circle; and a lower trunk portion 33B which protrudes from the nozzle holder 34. In the upper trunk portion 33U, a connection hole 333 is made which is used for supplying a predetermined processing gas to the cylindrical space 332.

This nozzle body 33 functions as the external conductor disposed around the central conductor 32. The central conductor 32 is inserted on the central axis of the cylindrical space 332, in a state where a predetermined ring-shaped space H (i.e., an insulation interval) is secured around it. The nozzle body 33 is fitted into the nozzle holder 34, so that the peripheral part of the upper trunk portion 33U comes into contact with the interior-circumferential wall of the lower hold space 341 of the nozzle holder 34. At the same time, the nozzle body 33 is fitted into it so that the top surface of the flange portion 33F comes into contact with a lower-end edge 343 of the nozzle holder 34. It is desirable that the nozzle body 33 be fixed to the nozzle holder 34 so as to be freely attached and detached, for example, using a plunger, a set screw or the like.

The nozzle holder 34 includes an upper trunk portion 34U (substantially corresponding to the position of the upper hold space 342) which is tightly fitted into a penetrating hole 131 made in the lower-plane plate 13B of the third wave-guide piece 13, and a lower trunk portion 34B (substantially corresponding to the position of the lower hold space 341) which extends downward from the lower-plane plate 13B. In the periphery of the lower trunk portion 34B, a gas supply hole 344 is formed which is used for supplying a processing gas to the ring-shaped space H.

As is not shown in any figure, to this gas supply hole 344, a tube joint or the like is attached which the end part of a gas supply pipe for supplying a predetermined processing gas is connected to. The gas supply hole 344 and the connection hole 333 of the nozzle body 33 are positioned so as to lead to each other when the nozzle body 33 is fitted in place into the nozzle holder 34. In order to prevent a gas from leaking from the joint of the gas supply hole 344 and the connection hole 333, the gas seal ring 37 is placed between the nozzle body 33 and the nozzle holder 34.

In terms of these gas supply hole 344 and connection hole 333, several such holes may also be made at regular intervals in the circumferential directions. In addition, without forming such holes toward the center in the radius directions, as shown in the above described Japanese Patent Laid-Open No. 2003-197397 specification, they may also be formed tangentially to the exterior-circumferential surface of the cylindrical space 332 so that a processing gas whirls round. Besides, the gas supply hole 344 and the connection hole 333 not necessarily have to be perpendicular to the central conductor 32. In order to make a processing gas flow more smoothly, they may also be formed slantwise from the side of the upper-end portion 321 to the side of the lower-end portion 322.

The seal member 35 is held in the upper hold space 342 of the nozzle holder 34, so that a lower-end edge 352 thereof comes into contact with an upper-end edge 334 of the nozzle body 33, and so that an upper-end edge 353 thereof comes into contact with an upper-end engagement portion 345 of the nozzle holder 34. In other words, the seal member 35 supporting the central conductor 32 is fitted into the upper hold space 342. Thus, it is embedded so that its lower-end edge 352 is pressed by the upper-end edge 334 of the nozzle body 33.

The protective tube 36 (not shown in FIG. 5) is formed by a quartz glass pipe with a predetermined length and the like. It has an external diameter which is substantially equal to the internal diameter of the cylindrical space 332 of the nozzle body 33. This protective tube 36 has the function of preventing an abnormal discharge (e.g., an arc discharge) at the lower-end edge 331 of the nozzle body 33 and radiating a plume P (mentioned later) normally. It is inserted into the cylindrical space 332 so that a part of it protrudes from the lower-end edge 331 of the nozzle body 33. Incidentally, the whole protective tube 36 may also be housed in the cylindrical space 332 so that its tip comes to the same position as the lower-end edge 331 or comes into the inside from the lower-end edge 331.

Figure 6:
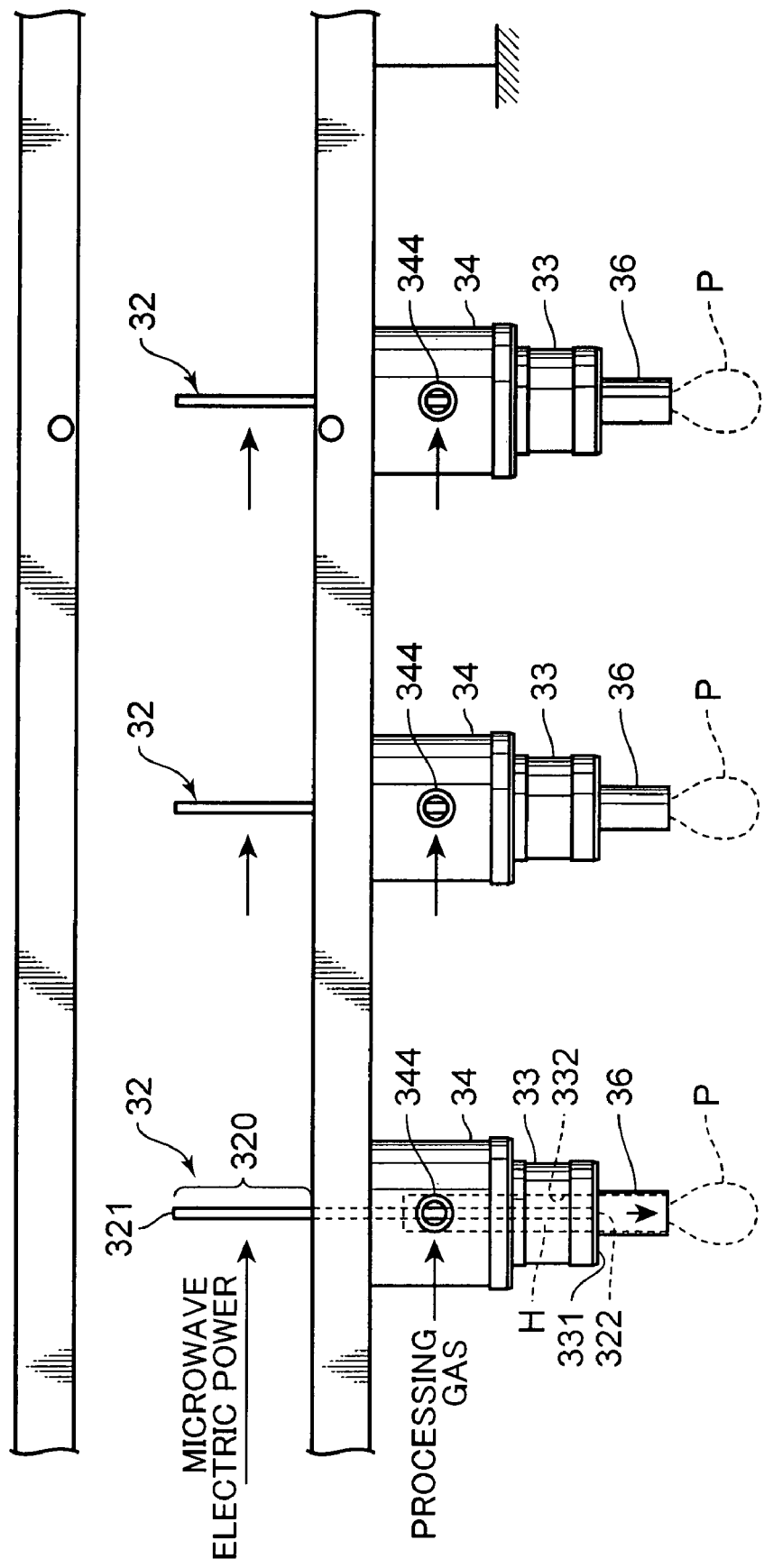
FIG. 6 is a side view of plasma generation nozzles if seen through, showing a plasma-generation state.

The plasma generation nozzle 31 is configured as described above, and consequently, the nozzle body 33, the nozzle holder 34 and the third wave-guide piece 13 (i.e., the wave guide 10) are kept electrically connected (i.e., they have the same electric potential). On the other hand, the central conductor 32 is supported by the insulating seal member 35, and thus, the former are electrically insulated from the latter members. Hence, as shown in FIG. 6, with the wave guide 10 kept at an earth potential, if a microwave is received by the receiving antenna portion 320 of the central conductor 32 and the microwave electric power is supplied to the central conductor 32, then an electric-field concentrated part is formed near its lower-end portion 322 and the lower-end edge 331 of the nozzle body 33.

In this sate, for example, if an oxygen-system processing gas such as an oxygen gas and air is supplied from the gas supply hole 344 to the ring-shaped space H, then the microwave electric power excites the processing gas, thereby generating plasma (i.e., an ionized gas) near the lower-end portion 322 of the central conductor 32. This plasma has an electron temperature of tens of thousands degrees, but its gas temperature is close to an external temperature. Hence, it is reactive plasma (i.e., plasma in which its electron temperature determined by the electrons is far higher than the gas temperature determined by the neutral molecules), and it is plasma generated under a normal pressure.

The processing gas subjected to such a plasma processing is radiated as the plume P from the lower-end edge 331 of the nozzle body 33, using a gas flow given from the gas supply hole 344. This plume P contains a radical, and for instance, an oxygen radical is generated if an oxygen-system gas is used as the processing gas. This helps the plume P have the function of decomposing and removing an organic matter, a resist-removing function, or the like. In the plasma generation unit PU according to this embodiment, a plurality of such plasma generation nozzles 31 are disposed, so that a line of such plumes P extending in the right-and-left directions can be generated.

By the way, if an inert gas such as an argon gas or a nitrogen gas is used as the processing gas, then in various substrates, their surfaces can be cleaned, or the surface qualities can be reformed. In addition, if a compound gas containing fluorine is used, the surface of a substrate can be turned to a water-repellent surface. In contrast, if a compound gas containing a water-affinity group is used, the surface of a substrate can be changed to a water-affinity surface. Besides, if a compound gas containing a metallic element is used, a metal thin-film layer can be formed on a substrate.

The sliding short 40 is used for making the state most suitable in which the central conductor 32 provided in each plasma generation nozzle 31 combines with a microwave propagated inside of the wave guide 10. In order to adjust a standing-wave pattern by changing the position in which a microwave is reflected, it is connected to the right end of the third wave-guide piece 13. Hence, unless a standing wave is used, the sliding short 40 is replaced with a dummy load which has the function of absorbing an electronic radio wave.

Figure 7:
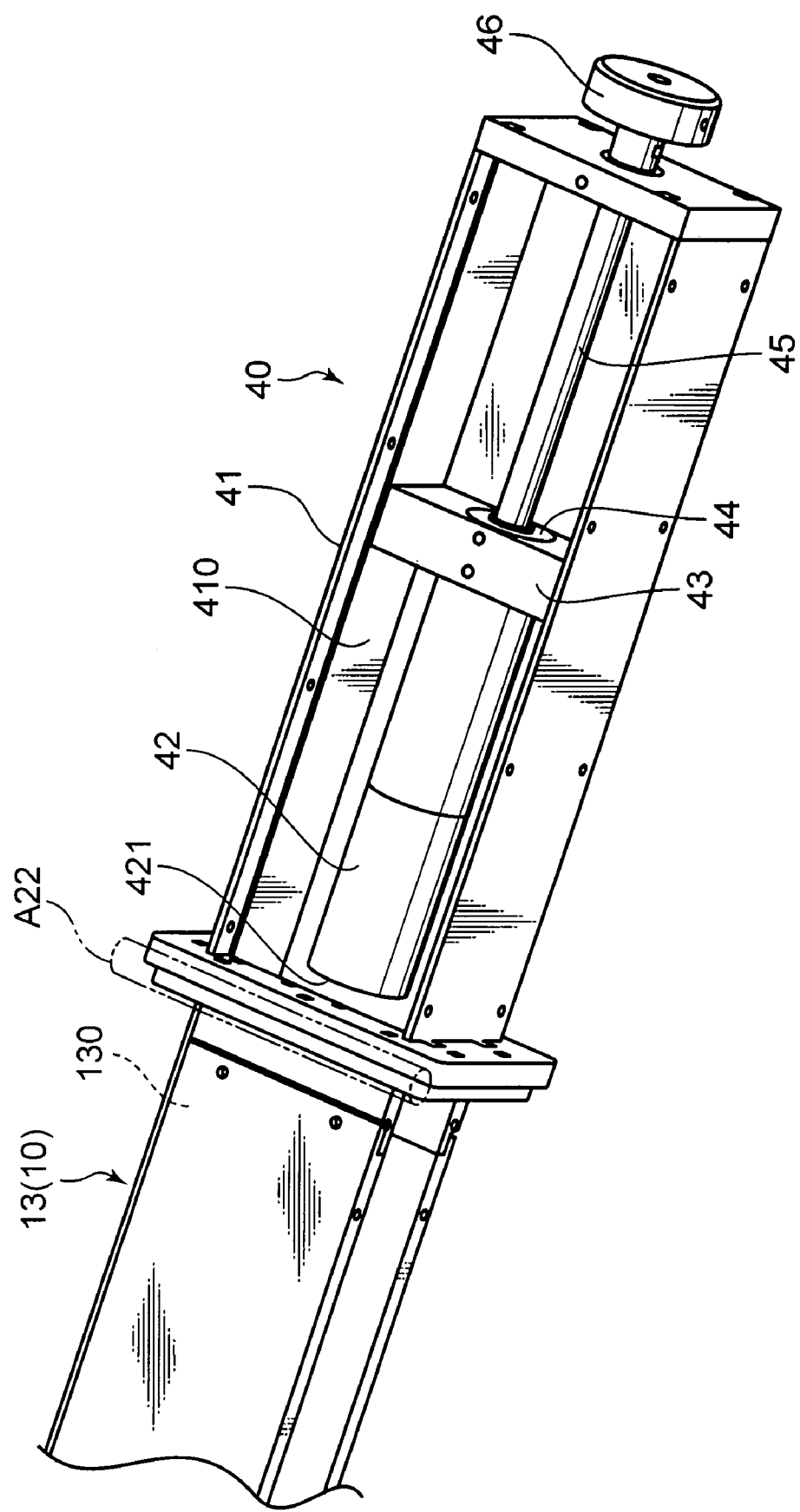
FIG. 7 is a perspective view of a sliding short if seen through, showing its internal structure.

FIG. 7 is a perspective view of the sliding short 40 if seen through, showing its internal structure. As shown in FIG. 7, the sliding short 40 has the structure of a frame body whose section is rectangular, as is the same as the wave guide 10. It includes: a frame-body portion 41 which is made of the same material as the wave guide 10 and has a hollow space 410; a columnar reflection block 42 which is housed in the hollow space 410; a rectangular block 43 which is united to the base end of the reflection block 42 and slides in the right-and-left directions inside of the hollow space 410; a movement mechanism 44 which is attached to this rectangular block 43; and an adjustment knob 46 which is connected via a shaft 45 directly to the reflection block 42.

The reflection block 42 is a columnar body which extends in the right-and-left directions so that a front-end surface 421 which reflects a microwave faces the wave-guidance space 130 of the third wave-guide piece 13. This reflection block 42 may also be shaped like a square pillar in the same way as the rectangular block 43. The movement mechanism 44 is a mechanism which moves the rectangular block 43 and the reflection block 42 united to this forward or backward in the right-and-left directions by turning the adjustment knob 46. If the adjustment knob 46 is rotated, then the reflection block 42 can be moved in the right-and-left directions while being guided inside of the hollow space 410 by the rectangular block 43. When this reflection block 42 moves, the position of the front-end surface 421 is adjusted, thereby optimizing the standing-wave pattern. Desirably, the adjustment knob 46 should be automatically turned, using a stepping motor or the like.

The circulator 50 is formed, for example, by a three-port circulator of a wave-guide type which has a ferrite pillar built-in. In terms of a microwave which is once propagated toward the plasma generation portion 30, the electric power of a part of it is not consumed in the plasma generation portion 30. Then, such a part returns as a reflected microwave. The circulator 50 brings the reflected microwave to the dummy load 60 without returning it to the microwave generation section 20. If this circulator 50 is provided, the reflected microwave can be prevented from overheating the microwave generation section 20.

Figure 8:
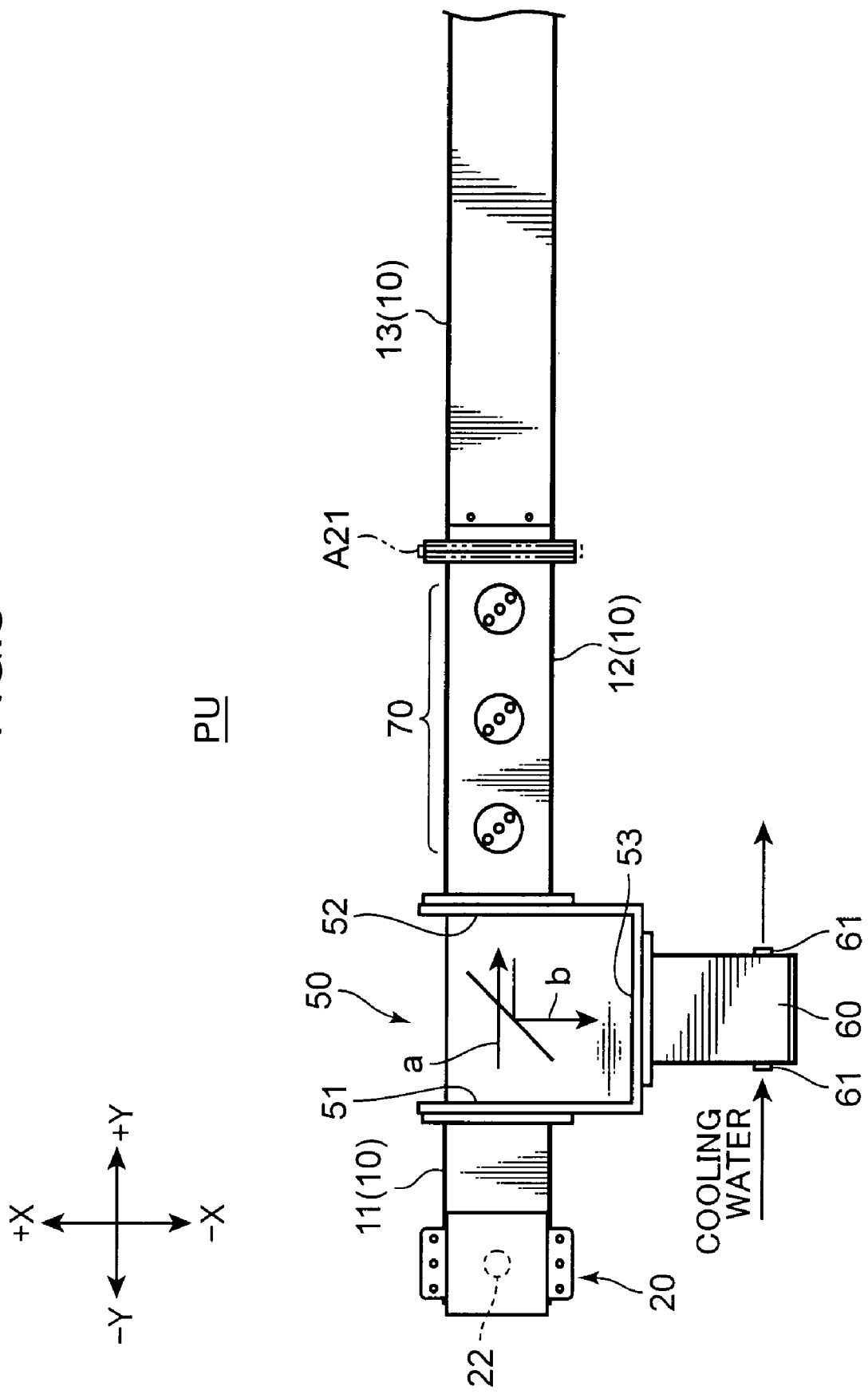
FIG. 8 is a top view of the plasma generation unit, showing the operation of a circulator.

FIG. 8 is a top view of the plasma generation unit PU, showing the operation of the circulator 50. As shown in the figure, the first wave-guide piece 11 is connected to a first port 51 of the circulator 50; the second wave-guide piece 12, to a second port 52; and further, the dummy load 60, to a third port 53, respectively. A microwave generated from the microwave transmission antenna 22 of the microwave generation section 20 goes, as shown by an arrow a, from the first port 51 via the second port 52 to the second wave-guide piece 12. On the other hand, a reflected microwave incident from the side of the second wave-guide piece 12 is deflected, as shown by an arrow b, toward the third port 53 from the second port 52. Then, it is incident upon the dummy load 60.

The dummy load 60 is a water-cooled (or air-cooled) electronic-wave absorber which absorbs the above described reflected microwave and converts it into heat. In this dummy load 60, a cooling-water flow hole 61 is provided for letting cooling water flow inside. Hence, a heat exchange is made between the heat produced by converting the reflected microwave and that of this cooling water.

Figure 9:
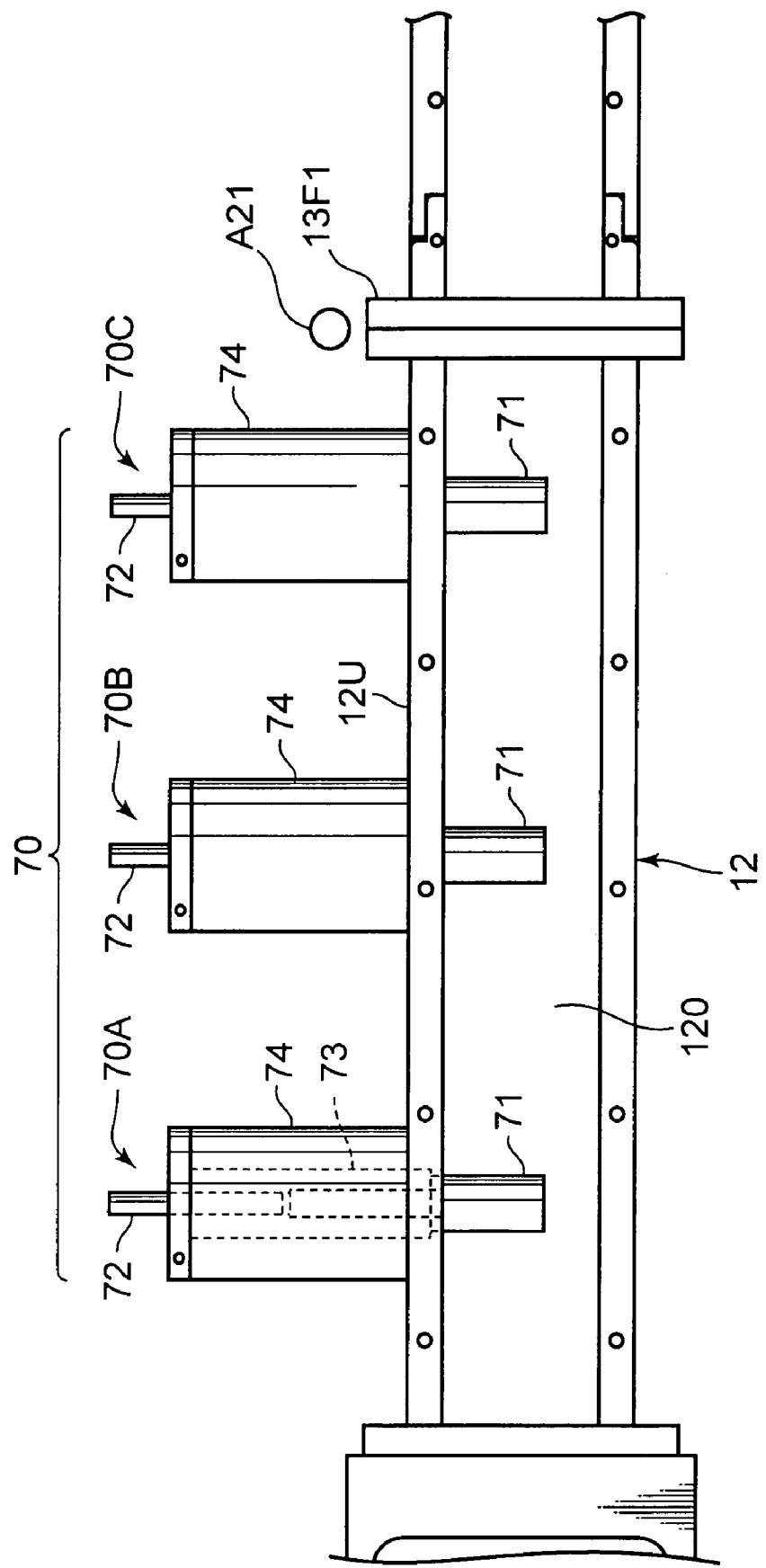
FIG. 9 is a side view of a stub tuner if seen through, showing its disposition.

The stub tuner 70 is used for making an impedance match between the wave guide 10 and the plasma generation nozzle 31. It is provided with three stub tuner units 70A to 70C which are arranged in series at predetermined intervals on an upper-plane plate 12U of the second wave-guide piece 12. FIG. 9 is a side view of the stub tuner 70 if seen through, showing its disposition. As shown in this figure, the three stub tuner units 70A to 70C have the same structure. They are each formed by: a stub 71 which protrudes a wave-guidance space 120 of the second wave-guide piece 12; an operation stick 72 which is directly connected to this stub 71; a movement mechanism 73 which moves the stub 71 in the up-and-down directions so that it appears and disappears; and an outside cover 74 which holds those members.

In terms of the stabs 71 provided in the stub tuner units 70A to 70C, their protrusion lengths in the wave-guidance space 120 can be independently adjusted by each operation stick 72. The protrusion lengths of these stubs 71 are determined, for example, by monitoring the microwave electric power and simultaneously searching a point at which the electric power consumed by the central conductor 32 comes to the maximum (i.e., a point at which the reflected microwave comes to the minimum). Such an impedance match is made, if necessary, in connection with the sliding short 40. Desirably, this operation of the stub tuner 70 should be automatically executed using a stepping motor or the like.

The carrying means C includes the several carriage rollers 80 which are disposed along a predetermined carriage path. The carriage rollers 80 are driven by a driving means (not shown). Thereby, the work W to be processed is carried via the plasma generation portion 30. Herein, as the work W to be processed, there can be exemplified a flat substrate such as a plasma display panel and a semiconductor wafer, a circuit wiring board on which electronic parts are mounted, and the like. Besides, non-flat parts, assembled parts or the like can also be processed, and in that case, such carriage rollers can be replaced with a belt conveyer or the like.

In the work processing apparatus S which has such a configuration as described so far, according to this embodiment, onto the opening 2 for carrying the work W in and the opening 3 for carrying it out of the shielding frame body 1 as well as flanges 13F1, 13F2 at both ends of the third wave-guide piece 13 of the plasma generation portion 30, there are attached rod-shaped microwave antennas A11, A12; A21, A22 (hereinafter, shown by reference character A when generally called). In terms of these microwave antennas A (as microwave detection unit), if the microwave with a frequency of 2.45 GHz is used, such a device is selected to have a length of, preferably, 2×n times or ½×n times as long as the wavelength $\lambda G = 230$ mm.

The microwave antennas A11, A12 as the microwave detection unit disposed in the opening 2 for carrying the work W in and the opening 3 for carrying it out are used for detecting a microwave leaking from these openings. As long as the microwave antennas A11, A12 are near the carrying-in opening 2 and the carrying-out opening 3, they may also be provided on either the inside or the outside. However, if they are on the inside, a microwave is easier to catch, and thus, they may also be suitably determined in accordance with the disposition of the carriage rollers 80, piping, wiring or auxiliary equipment (not shown), or the like.

The microwave antennas A21, A22 disposed on the flanges 13F1, 13F2 at both ends of the third wave-guide piece 13 are used for detecting a microwave leaking from its joint part to the second wave-guide piece 12 on the side of the stub tuner 70 and the sliding short 40 by means of the flanges 13F1, 13F2.

Figure 11:
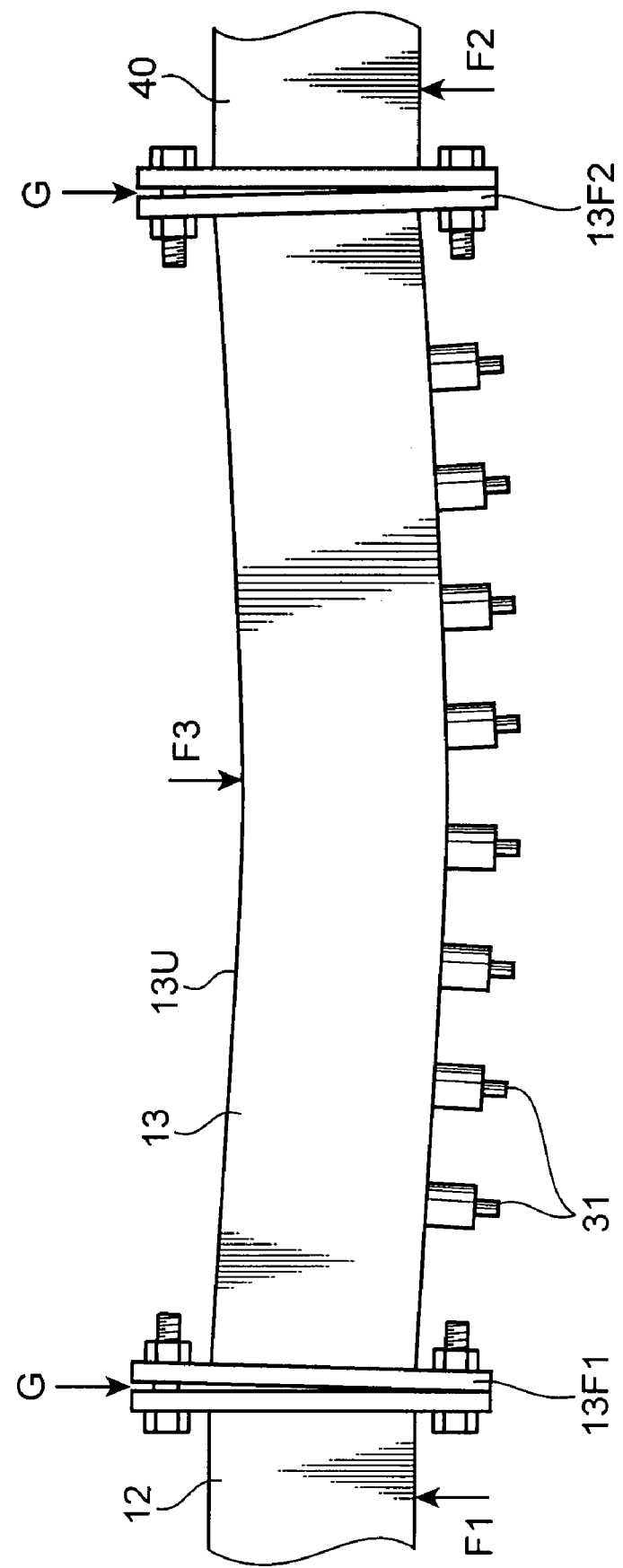
FIG. 11 is a front view of a third wave-guide piece of a plasma generation portion, showing its deflection.

Herein, as shown in FIG. 11, in the third wave-guide piece 13 of the plasma generation portion 30, a great number of plasma generation nozzles 31 are provided as described earlier. Besides, the work W is carried directly below them, and thus, as shown by reference characters and numerals F1 and F2, it is supported to the frame body 1 by the second wave-guide piece 12 on the side of the stab tuner 70 and the sliding short 40 which are located on both sides. Therefore, as shown by reference character and numeral F3, the middle part of the third wave-guide piece 13 deflects, thereby pulling an upper-plane plate 13U downward.

Consequently, if an earthquake occurs, if the apparatus is moved for reinstallation, or if an accident happens when a person handles it, then the apparatus can be vibrated or given an impact. This may produce a gap G between the upper planes of the joint part of each flange 13F1, 13F2, and a microwave can leak from this gap G. Hence, it is preferable that the microwave antennas A21, A22 be placed near the joint parts, above all, as described above, above the joint parts.

Figure 10:
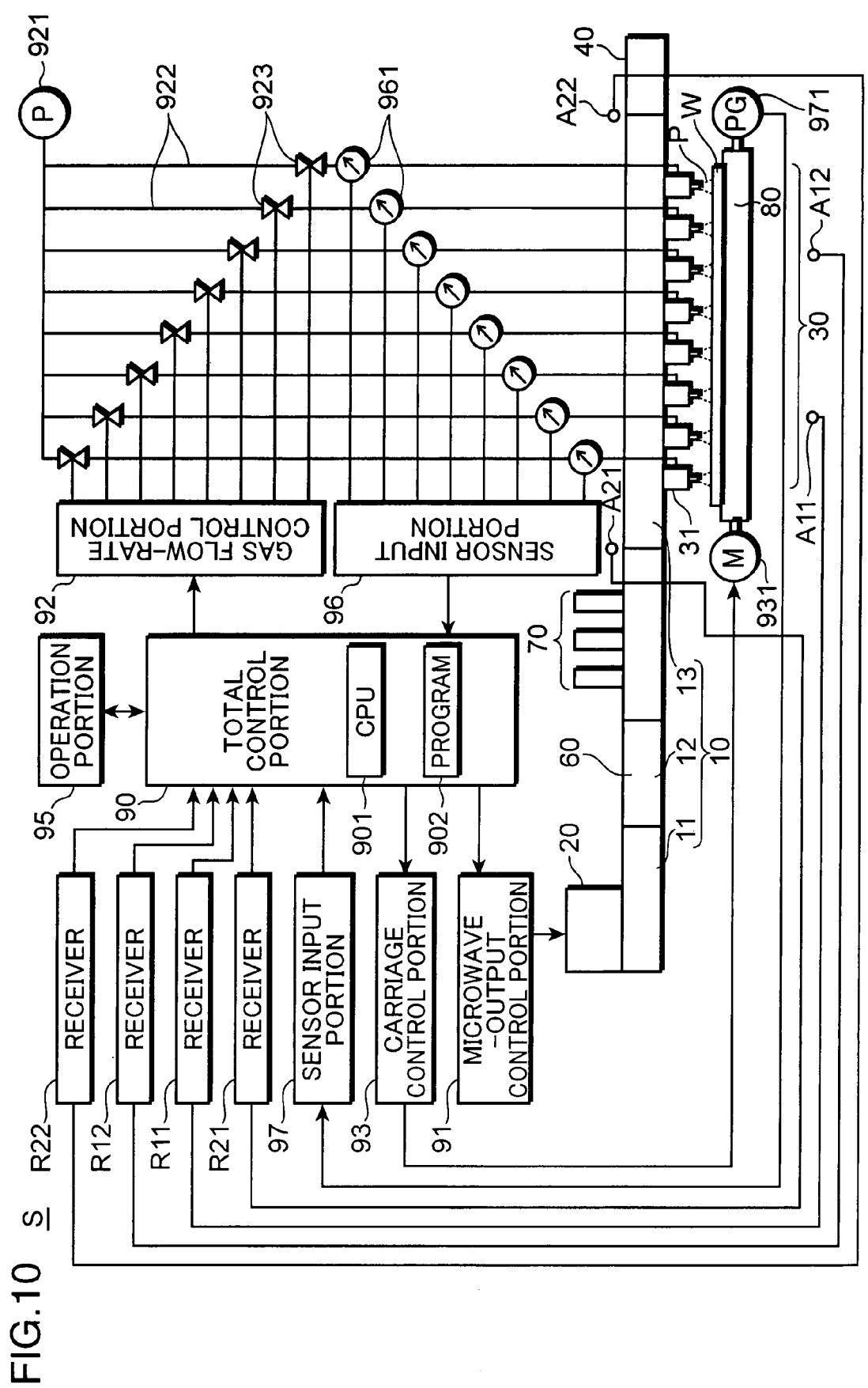
FIG. 10 is a block diagram, showing a control system of the work processing apparatus.

Next, a description will be given about the electrical configuration of the work processing apparatus S according to this embodiment. FIG. 10 is a block diagram, showing a control system of the work processing apparatus S. This control system includes: a total control section 90 which is made up of a CPU (or central processing unit) 901, its peripheral circuit and the like; a microwave-output control section 91 which is made up of an output interface, a drive circuit and the like; a gas flow-rate control section 92 and a carriage control section 93; an operation portion 95 which is made up of a display means, an operation panel and the like, and gives a predetermined operation signal to the total control section 90; sensor input portions 96, 97 which is made up of an input interface, an analog/digital converter and the like; receivers R11, R12; R21, R22 (hereinafter, shown by reference character R when generally called); and sensors 961, 971, a drive motor 931 and a flow-rate control valve 923.

The microwave-output control section 91 executes the ON-OFF control and output-intensity control of a microwave outputted from the microwave generation section 20. It generates a pulse signal which has the above described frequency of 2.45 GHz and executes the operation control of the generation of a microwave by the unit body portion 21 of the microwave generation section 20.

The gas flow-rate control section 92 controls the flow rate of a processing gas supplied to each plasma generation nozzle 31 of the plasma generation portion 30. Specifically, it regulates the opening level of the flow-rate control valve 923 disposed in a gas supply pipe 922 which connects a processing-gas supply source 921 such as a gas cylinder and each plasma generation nozzle 31.

The carriage control section 93 controls the operation of the drive motor 931 which rotates the carriage rollers 80. It controls the start/stop of the work W's carriage, its carriage speed, and the like.

The total control section 90 governs the total operation control of the work processing apparatus S. In response to an operation signal given from the operation portion 95, it monitors the result of a measurement by the flow-rate sensor 961 which is inputted from the sensor input portion 96, the result of a measurement of the work W's carriage speed by the flow-rate sensor 971 which is inputted from the sensor input portion 97, or the like. Based on a predetermined sequence, it controls the operation of the microwave-output control section 91, the gas flow-rate control section 92 and the carriage control section 93.

Specifically, on the basis of a control program stored beforehand in a memory 902, the CPU 901 executes control so as to start carrying the work W and lead the work W to the plasma generation portion 30. Then, it gives a microwave electric power to generate plasma (i.e., the plume P) while supplying a processing gas at a predetermined flow rate to each plasma generation nozzle 31. Next, it executes control so that the work W is carried, and simultaneously, the plume P is radiated onto its surface. This makes it possible to process a plurality of such works W continuously.

At this time, the CPU 901 takes in the antenna-power level of 2.45 GHz received by each microwave antenna A described above from the receiver R provided for each microwave antenna A. If the antenna power is equal to, or above, a level determined in advance, for example, 5 mW/cm2, then the CPU 901 decides that the microwave is leaking. Then, it executes an interlock operation for allowing the microwave-output control section 91 to stop generating the microwave.

Along with this, via the operation portion 95 which has a notification function, the CPU 901 informs an operator that the microwave is leaking. In terms of how to notify the operator, any means may also be used, like using the sense of hearing such as the ring of a buzzer, using the sense of sight such as the luminescence of a lamp and the indication of a display means, or the like. It is also desirable that an indication be given of which of the plurality of microwave antennas A has detected a leak. This helps an operator cope with the leak more easily.

As is obvious from the above description, the microwave antenna A and receiver R according to this embodiment correspond to the detection unit ("reception unit") according to the claimed invention which detects a microwave. In addition, the total control section 90 corresponds to the control section as well as the notification portion according to the claimed invention.

In the above description, the receiver R outputs the level of an antenna power, the CPU 901 decides whether or not the microwave is leaking based on this level and executes the operation of stopping the microwave and giving notice to that effect. Instead of this, if an antenna power beyond a predetermined level has been detected, the receiver R may also calculate the output. Then, without the CPU 901 deciding on this output, the main electric supply may also be shut off in response to the output to put a stop to the microwave. Besides, using the threshold value of 5 mW/cm2, a decision is made whether or not a microwave is leaking, but several threshold values may also be set. In that case, only a notification is first given, and sequentially, the microwave is cut off. In other words, the total control section 90's response operation is switched in accordance with the level of leakage.

In the work processing apparatus S described so far, the work carrying means C can carry the work W, and at the same time, a plasma gas can be radiated to the work W from the plurality of plasma generation nozzles 31 attached in a line to the wave guide 10. Therefore, a plurality of works to be processed can undergo a plasma processing continuously, and a work which has a large area can be efficiently subjected to the plasma processing. Accordingly, compared with a work processing apparatus of the batch processing type, a plasma processing can be given more efficiently to various works to be processed. As a result, the work processing apparatus S or the plasma generation unit PU which has such an advantage can be provided. Besides, plasma can be generated at an external temperature and pressure, and thus, there is no need for a vacuum chamber or the like. This makes it possible to simplify the configuration of facilities.

Furthermore, a microwave generated from the microwave generation section 20 is received by the central conductor 32 provided in each plasma generation nozzle 31. On the basis of the energy of this microwave, a plasma gas can be emitted from each plasma generation nozzle 31. This helps simplify the transmission system of the energy owned by the microwave to each plasma generation nozzle 31. Consequently, the configuration of such an apparatus becomes simpler, thereby cutting down on costs and realizing such another.

Moreover, the plasma generation portion 30 made up of the several plasma generation nozzles 31 arranged in a line has a width substantially equal to the size t in the width direction perpendicular to the direction in which the flat work W is carried. Therefore, once the work W is passed through the plasma generation portion 30 by the carrying means C, the processing of its whole surface can be completed. This helps give a plasma processing far more efficiently to such a flat work. Besides, a plasma gas can be radiated in the same timing to the work W which comes being carried. This makes it possible to execute a homogenous surface processing or the like.

In addition, as described already, such an apparatus is used under a normal pressure. Hence, even if a vibration or an impact unexpectedly causes a microwave to leak out, then without using a dedicated measuring device, this leakage can be detected. Then, the total control section 90 stops the microwave's generation and informs an operator to that effect, thus enhancing its safety.

Furthermore, as described above, the plasma generation portion 30 is provided with the several plasma generation nozzles 31. In this case, the more plasma generation nozzles are provided, the more strongly the upper part of the junction surface of the flanges 13F1, 13F2 (see FIG. 1 and FIG. 11) is pulled and deflected because of their total weight. Thereby, such a vibration or an impact as described earlier can produce the gap G more easily. In short, a microwave is more likely to leak out, and thus, the present invention is especially effective.

In this embodiment, in the shielding frame body 1 which screens out a microwave, a processing gas or the like of the plasma generation unit PU capable of generating plasma under a normal pressure, the microwave antennas A11, A12 are provided in the carrying-in opening 2 and the carrying-out opening 3 which are openings for processing the work W continuously. Hence, according to this embodiment, in preference, a microwave can be detected leaking from those carrying-in opening 2 and carrying-out opening 3 which an operator can get access to (e.g., put a hand in or look into).

Moreover, the microwave antenna A11 provided in the carrying-in opening 2 can detect a microwave leaking from the monitoring window 4 for looking in at the plume P's state or the like. Besides, the microwave antennas A21, A22 provided above the flanges 13F1, 13F2 at both ends of the third wave-guide piece 13 of the plasma generation portion 30 can efficiently detect a microwave leaking from the joint part of the wave guide 10 which has a weak structure.

Figure 12:
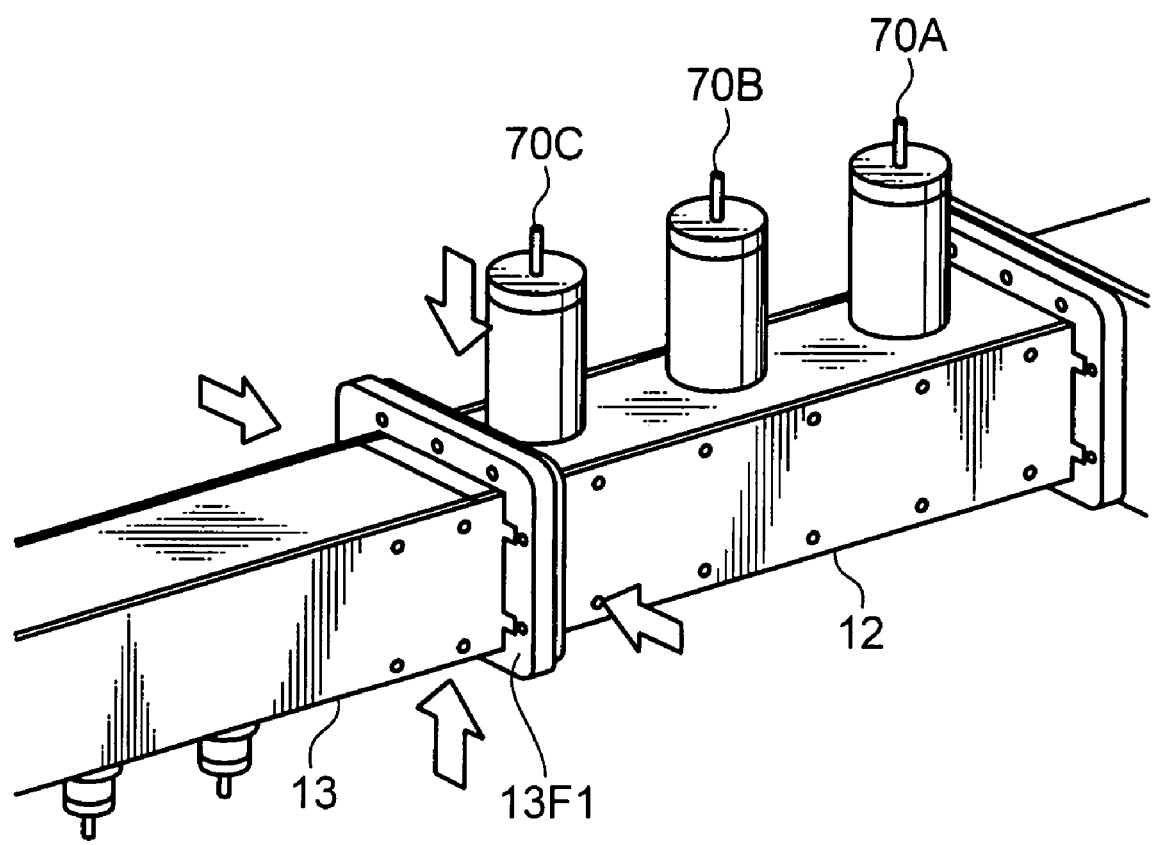
FIG. 12 is a perspective view of the third wave-guide piece, showing another example of the attachment of a microwave antenna to it.

Incidentally, the microwave antenna A may also be provided in any place, so long as it is outside of the wave guide 10. For example, as shown by the arrows of FIG. 12, if the microwave antennas A are provided on the four sides of the flange 13F1, leakage can detected all over its periphery. Thereby, if maintenance such as cleaning is conducted, then based on whether or not a microwave is leaking out, a decision can be made whether such an apparatus has been assembled.

Figure 13:
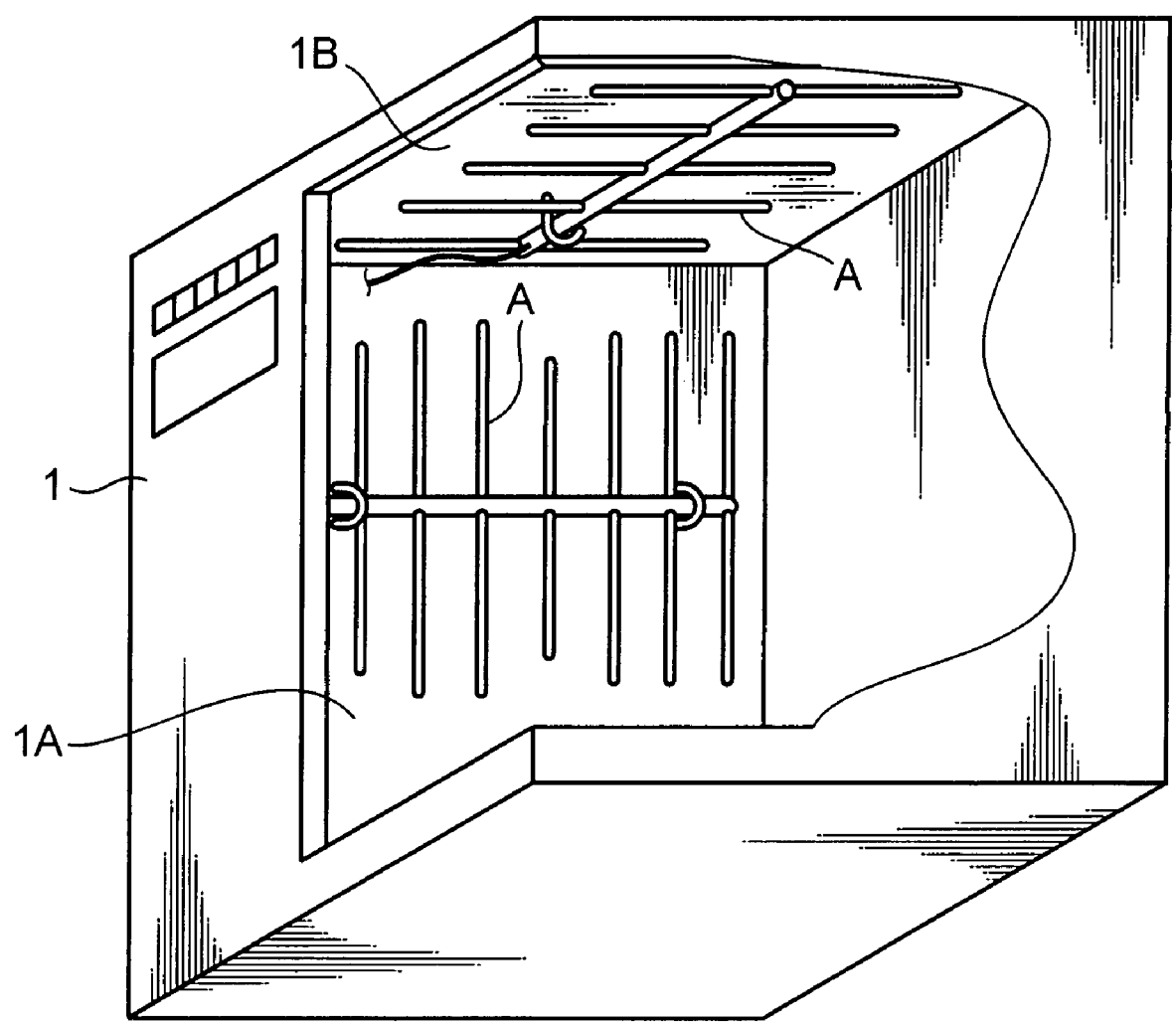
FIG. 13 is a perspective view of the microwave antenna, showing still another example of its attachment.

In addition, as shown in FIG. 13, if the microwave antenna A is provided on a wall surface 1A or a ceiling surface 1B of the shielding frame body 1, then wherever a microwave is leaking from, it is repeatedly reflected inside of the frame body 1. This makes it possible to detect a leak efficiently, even though less such antennas are only provided. In this case, as the microwave antenna A, preferably, a non-directional or semi-non-directional antenna should be used, so that a microwave can be caught, no matter how it is reflected inside of the frame body 1.

In the case where it is attached to the wall surface 1A or the ceiling surface 1B, it is preferable that a flat antenna be used. Besides, if the wall surface 1A or the ceiling surface 1B is bent, then more desirably, such an antenna should be attached along the bend, or the antenna itself should be curved. To the wall surface 1A, a flat antenna can be attached, in the same way as a picture frame, for example, by fixing at least two lower points and at least one upper point thereof to the wall surface 1A. On the other hand, to the ceiling surface 1B, a flat antenna can be attached by hanging it at its four corners.

However, for example, which side another part of the wave guide 10 is deflected toward differs according to which place of the wave guide 10 is supported to the frame body 1. Hence, the positions in which the microwave antennas A are provided may be suitably determined, in as many places as and with as high precision as permitted from the viewpoint of costs, as described earlier, in accordance with the disposition of piping, wiring or auxiliary equipment, or the like. If it is provided especially in a place which is structurally weak and where a leak is more likely, that will be more efficient.

Figure 14:
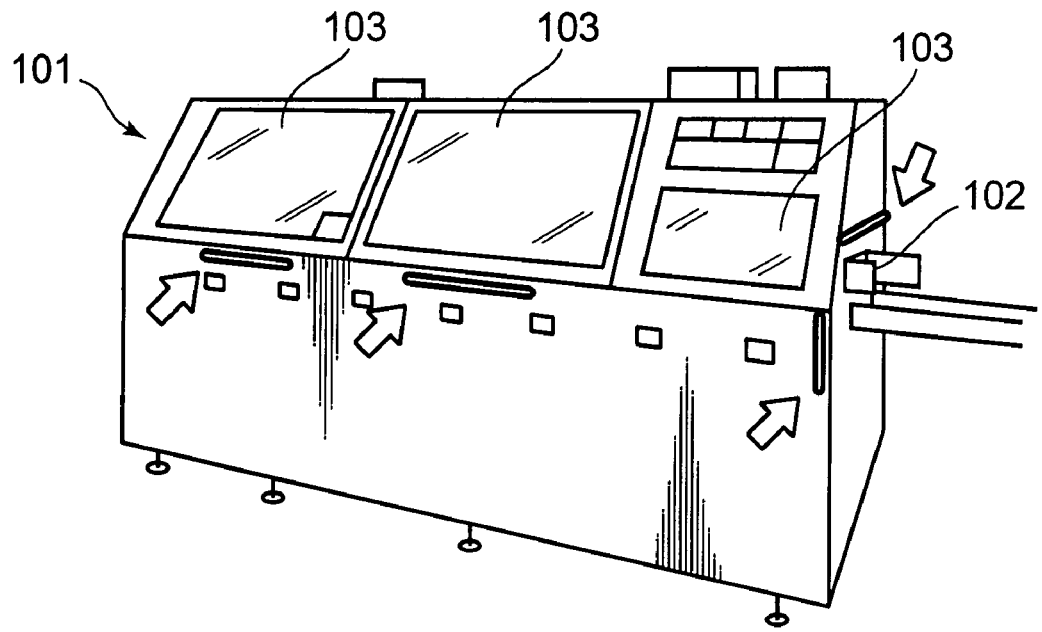
FIG. 14 is a perspective view, showing another example of the attachment of the microwave antenna.
Figure 15:
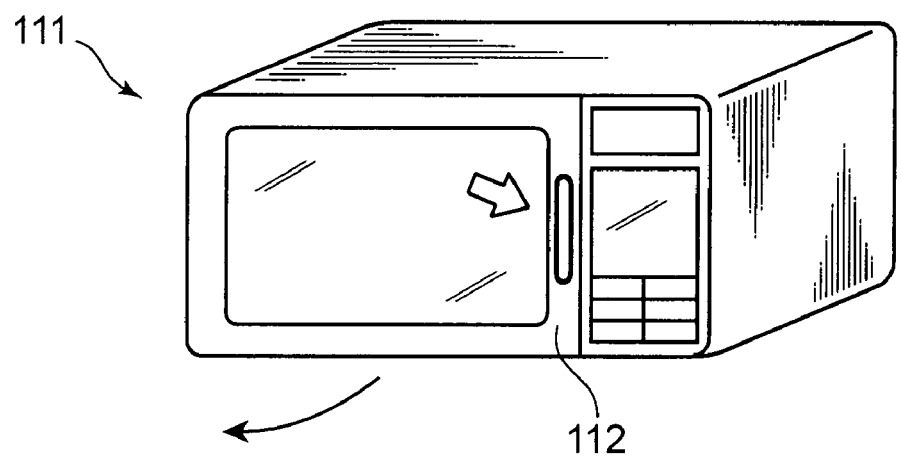
FIG. 15 is a perspective view, showing still another example of the attachment of the microwave antenna.

As shown in FIG. 14, in the case where large equipment 101 is provided with an opening portion 102 or doors 103, as shown by the arrows, it is desirable that microwave antennas be provided at several places near such opening portions where a microwave can be efficiently caught. Besides, as shown in FIG. 15, in the case of small equipment 111, as shown by a arrow, a microwave antenna may also be provided only in the part of a front door 112. The equipment 101 of FIG. 14 is an apparatus, for example, which cleans flux from a substrate subjected to soldering. The plasma generation unit PU is incorporated into a flow tank. The equipment 111 of FIG. 15 is, for example, a sterilizer used for disinfecting medical equipment. Deep on the right inside of its body, the plasma generation unit PU is disposed, and the equipment placed inside is irradiated with plasma.

Hereinbefore, a description is given about the work processing apparatus S according to an embodiment of the present invention. However, the present invention is not limited to this, and thus, for example, the following embodiments can be adopted.

(1) In the above described embodiment, an example is shown in which the plurality of plasma generation nozzles 31 are arranged in a line. However, the array of such nozzles may also be suitably determined in accordance with the work W's shape, a microwave electric power, or the like. For example, in the direction in which the work W is carried, several lines of such plasma generation nozzles 31 may also be arranged in a matrix form or in a zigzag form.

(2) In the above described embodiment, an example is shown in which the carrying means C which carries the work W is used as the moving means, and as the carrying means C, the work W is placed and carried on the upper surface of the carriage rollers 80. In addition to this, for example, the work W may also be nipped and carried between upper and lower carriage rollers. Without using any carriage rollers, the work W may also be stored a predetermined basket or the like. Then, the basket or the like is carried by a line conveyer or the like. Or, the work W may also be grasped by a robot hand or the like to carry it to the plasma generation portion 30. Or, as the moving means, the side of the plasma generation nozzles 31 may also be designed to make a motion. In other words, the work W and the plasma generation nozzles 31 may also move relatively to each other on the plane (i.e., the X-Y plane) that intersects the plasma irradiation direction (i.e., the Z direction).

(3) In the above described embodiment, a magnetron which generates a microwave with a frequency of 2.45 GHz is illustrated as the microwave generation source. However, various high-frequency power sources other than a magnetron can also be used. Besides, a microwave having a different frequency from 2.45 GHz may also be used.

(4) In order to measure a microwave electric power inside of the wave guide 10, desirably, a wattmeter should be provided in a proper place of the wave guide 10. For example, in order to detect the ratio of a reflected-microwave electric power to a microwave electric power emitted from the microwave transmission antenna 22 of the microwave generation section 20, a wave guide in which a wattmeter is embedded can be placed between the circulator 50 and the second waveguide piece 12.

The work processing apparatus and plasma generation apparatus according to the present invention can be suitably applied to an etching apparatus or a film formation apparatus for a semiconductor substrate such as a semiconductor wafer, a cleaning apparatus for a glass substrate such as a plasma display panel or a printed wiring board, a sterilization apparatus for medical equipment or the like, a protein decomposition apparatus, and the like.

Herein, the above described specific embodiments mainly include the invention which has the following configurations.

A plasma generation apparatus according to an aspect of the present invention, comprising: an apparatus main body which includes a microwave generation section which generates a microwave, and a plasma generation nozzle which generates and emits a plasma gas based on the energy of the microwave; a microwave detection unit which detects (receives) a microwave leaking from the apparatus main body; and a control section which stops the microwave generation section from generating a microwave if the detection unit detects a microwave.

Furthermore, a plasma generation apparatus according to another aspect of the present invention, comprising: an apparatus main body which includes a microwave generation section which generates a microwave, and a plasma generation nozzle which generates and emits a plasma gas based on the energy of the microwave; a microwave detection unit which detects a microwave leaking from the apparatus main body; and a notification portion which gives notice if the detection unit detects a microwave.

According to the above described configuration, the detection unit which detects a microwave is suitably provided, for example, in as many places as and with as high precision as permitted from the viewpoint of costs, in a place which is structurally weak and where a leak is more likely in the plasma generation apparatus. For example, the detection unit measures an antenna power which has a frequency of 2.45 GHz. If it is equal to, or above, a level determined in advance, for example, 5 mW/cm2, then the control section stops the microwave generation section from generating the microwave.

If an earthquake occurs, if the apparatus is moved for reinstallation, or if an accident happens when a person handles it, then the apparatus can be vibrated or given an impact. However, even if that unexpectedly causes a microwave to leak out, this leakage can be detected and the microwave's generation can be stopped. This helps enhance its safety.

A plasma generation apparatus according to another aspect of the present invention, comprising: an apparatus main body which includes a microwave generation section which generates a microwave, and a plasma generation nozzle which generates and emits a plasma gas based on the energy of the microwave; a microwave detection unit which detects a microwave leaking from the apparatus main body; and a notification portion which gives notice if the detection unit detects a microwave.

According to the above described configuration, the detection unit which detects a microwave is suitably provided, for example, in as many places as and with as high precision as permitted from the viewpoint of costs, in a place which is structurally weak and where a leak is more likely in the plasma generation apparatus. For example, the detection unit measures an antenna power which has a frequency of 2.45 GHz. If it is equal to, or above, a level determined in advance, for example, 5 mW/cm2, then the notification portion informs an operator of that. In terms of how to notify the operator, any means may also be used, like using the sense of hearing such as the ring of a buzzer, using the sense of sight such as the luminescence of a lamp and the indication of a display portion, or the like.

If an earthquake occurs, if the apparatus is moved for reinstallation, or if an accident happens when a person handles it, then the apparatus can be vibrated or given an impact. However, even if that unexpectedly causes a microwave to leak out, this leakage can be detected and reported, thus helping enhance its safety.

Moreover, a work processing apparatus according to still another aspect of the present invention which irradiates a work with plasma and gives a predetermined processing, comprising: a plasma generation apparatus which irradiates the work with a plasma gas from a predetermined direction; and a movement mechanism which moves the work and the plasma generation apparatus relatively on a plane that intersects a direction where a plasma gas is applied, wherein the plasma generation apparatus includes any such configuration as described above.

In this work processing apparatus, a microwave is detected leaking out, and the microwave's generation is stopped or an operator is notified to that effect. Therefore, a work processing apparatus can be realized which is capable of enhancing safety.

In the above described configuration, it is desirable that a first wave guide be provided for propagating the microwave, the first wave guide having a plurality of such plasma generation nozzles attached in array thereto.

According to this configuration, the first wave guide is easily deflected because of the weight of the plasma generation nozzles. Thereby, in its junction surface to another part, a gap can be easily produced. Hence, a microwave is more likely to leak out, and thus, the present invention is especially effective.

In this case, it is desirable that a second wave guide be further provided which is joined to the first wave guide, and the detection unit be disposed at least above the junction surface of the first wave guide and the second wave guide.

According to this configuration, in terms of the first wave guide to which a plurality of plasma generation nozzles are attached, it is deflected because of the weight of the plasma generation nozzles. Then, the upper part of its junction surface to the second wave guide is pulled, and thus, such a vibration or an impact as described above is more likely to produce a gap. The detection unit is provided around the junction surface or at least above it, thereby helping efficiently detect a microwave leaking out.

In the above described configuration, it is desirable that a frame body be provided which covers the apparatus main body, the frame body being formed by a member which screens out or attenuates the microwave, and the detection unit be disposed at and near a place of the frame body where a user has access to the inside of the frame body.

According to this configuration, in the frame body, at its metal part or such another which can screen out or attenuate a microwave, the microwave is screened out or attenuated even if it is leaking. However, in a place which an operator can get access to (e.g., put a hand in or look into), such as an opening portion, a door and a window, which is provided in the frame body, a microwave may leak out. If the detection unit is provided in preference in such a place, a microwave can be efficiently detected leaking out.

This application is based on Japanese patent application serial No. 2006-042197, filed in Japan Patent Office on Feb. 20, 2006, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A plasma generation apparatus, comprising:
   an apparatus main body including:
   a microwave generation section which generates a microwaves,
   a first waveguide receiving and directing the microwaves, the first waveguide having an upper plate and a lower plate;
   a plurality of plasma generation nozzles configured to receive the microwaves and produce a plasma gas using energy of the microwaves;
   said plasma generation nozzles being attached to the lower plate of the first waveguide, each of said plasma generation nozzles including:
   a central conductor having an upper end, a lower end, a central axis, and a circumferential surface having a mid-region situated removed from and between the upper end and the power end;
   a seal member surrounding and engaging the mid-region of the circumferential surface of the central conductor;
   a seal member surrounding and engaging the mid-region of the circumferential surface of the central conductor;
   a nozzle body having a longitudinally extending central through hole which houses the central conductor therein, said nozzle body has a hollow cylindrical configuration having an upper trunk part and a lower trunk part, and a flange portion between the upper trunk part and the lower trunk part, and a connection hole defined by the upper trunk part of the nozzle body, and communicating with the through hole and extending through the nozzle body;
   a nozzle holder attached to the lower plate of the first waveguide and supporting the nozzle body and the seal member such that the central conductor is supported and extends into the central through hole of the nozzle body, and a predetermined length of the central conductor including the upper end protrudes through an aperture in the lower plate of the first wave guide and into the first waveguide, and
   said nozzle holder defining a gas supply hole and accepting said nozzle body so that said gas supply hole communicates with said connection hole such that a gas supplied to the gas supply hole is introduced into the central through hole of the nozzle body below the waveguide;
   a microwave detection unit for detecting a microwave microwaves leaking from the main body; and
   a control section for stopping the microwave generation section from generating if the detection unit detects a microwave.

2. The plasma generation apparatus according to claim 1, further comprising a second waveguide which is joined to the first waveguide, wherein the detection unit is disposed at least above the junction surface of the first waveguide and the second waveguide.

3. The plasma generation apparatus according to claim 1, further comprising:
   a frame body forming a walled enclosure enclosing an entirety of the apparatus main body and a work area configured to accept a workpiece situated in area exposed to said plasma gas produced by said nozzle, the frame body being formed of a material which screens out or attenuates the microwaves;
   the frame body includes at least one wall defining an access opening configured to permit insertion of the workpiece to be acted on by the plasma gas, wherein the detection unit is disposed adjacent the access opening.

4. The plasma generation apparatus according to claim 1, wherein said nozzle body is made of a conductive metal, said nozzle holder is made of a conductive metal, and the seal member is made of an insulating material.

5. The plasma generation apparatus according to claim 4, wherein: the nozzle holder has a hollow cylindrical configuration having an upper engagement portion and a lower engagement portion;

said seal member is entirely fitted into the upper engagement portion;

said upper trunk part of the nozzle body is fitted into the lower engagement portion of the nozzle holder such that an upper surface of the flange portion contacts a lower end of the nozzle holder.

6. The plasma generation apparatus according to claim 5, wherein:

said connection hole is defined by the upper trunk part of the nozzle body; and the upper trunk part of the nozzle body has a circumferential groove at a position lower than the gas supply hole and a gas seal ring disposed in the circumferential groove engaging a groove surface of said circumferential groove and an inner circumferential surface of the nozzle holder so as to prevent leakage of the gas supplied to the gas supply hole.

7. The plasma generation apparatus according to claim 1, wherein said plasma generation nozzle further includes a protective tube which is provided at a lower end of the nozzle body to prevent an abnormal discharge of plasma.

8. The plasma generation apparatus according to claim 7, wherein said protective tube is formed of a quartz glass pipe.

9. The plasma generation apparatus according to claim 8, wherein the protective tube has a lower end that protrudes downward from the lower end of the nozzle body.

10. A plasma generation apparatus, comprising:
an apparatus main body including:
a microwave generation section which generates and emits microwaves;
a first wave guide arranged to direct the microwaves from the microwave generation section;
a plasma generation nozzle configured to receive the microwaves and produce a plasma gas using energy of the microwaves; and
said plasma generation nozzles being attached to the first waveguide;
a microwave detection unit for detecting microwaves leaking from the main body;
a control section for stopping the microwave generation section from generating the microwaves if the detection unit detects microwaves leaking; and
a frame body forming a walled enclosure enclosing an entirety of the apparatus main body and the microwave detection unit, the flame body being formed of a material which screens out or attenuates the microwaves;
wherein the plasma generation nozzle includes:
a central conductor having an upper end, a lower end, a central axis, and a circumferential surface having a mid-region situated removed from and between the upper end and the rower end;
a seal member surrounding and engaging the mid-region of the circumferential surface of the central conductor;
a nozzle body having a longitudinally extending central through hole which houses the central conductor therein, said nozzle body has a hollow cylindrical configuration having a upper trunk part and a lower trunk part, and a flange portion between the upper trunk part and the lower trunk part, and a connection hole defined by the upper trunk part of the nozzle body, and communicating with the through hole and extending through the nozzle body;
a nozzle holder attached to the lower plate of the first waveguide and supporting the nozzle body and the seal member such that the central conductor is supported and extends into the central through hole of the nozzle body, and a predetermined length of the central conductor including the upper end protrudes through an aperture in the lower plate of the first wave guide and into the first waveguide, and
said nozzle holder defining a gas supply hole and accepting said nozzle body so that said gas supply hole communicates with said connection hole such that a gas supplied to the gas supply hole is introduced into the central through hole of the nozzle body below the waveguide.

11. The plasma generation apparatus according to claim 10, wherein said apparatus main body further includes a plurality of the plasma generation nozzles arranged in an array and attached to the first wave guide.

* * * * *